United States Patent
Zhu et al.

(10) Patent No.: US 7,951,674 B2
(45) Date of Patent: May 31, 2011

(54) METHOD FOR FABRICATING A SONOS MEMORY

(75) Inventors: Jun Zhu, Shanghai (CN); Ming Li, Shanghai (CN)

(73) Assignee: Shanghai IC R&D Center Co., Ltd., Shanghai (CN)

( * ) Notice: Subject to any disclaimer, the term of this patent is extended or adjusted under 35 U.S.C. 154(b) by 0 days.

(21) Appl. No.: 12/648,073

(22) Filed: Dec. 28, 2009

(65) Prior Publication Data

US 2011/0039405 A1 Feb. 17, 2011

(30) Foreign Application Priority Data

Aug. 14, 2009 (CN) .......................... 2009 1 0056491

(51) Int. Cl.
*H01L 21/336* (2006.01)

(52) U.S. Cl. ..................................................... 438/261

(58) Field of Classification Search .................. None
See application file for complete search history.

(56) References Cited

U.S. PATENT DOCUMENTS 7,855,117 B2 * 12/2010 Jang et al. ..................... 438/297

* cited by examiner

*Primary Examiner* — Scott B Geyer
(74) *Attorney, Agent, or Firm* — Rabin & Berdo, PC

(57) ABSTRACT

The present invention provides a method for making SONOS memory, comprising the following steps: depositing silicon oxide layer and silicon oxynitride layer in sequence on underlayer; coating a layer of photoresist on the silicon oxynitride layer; removing part of the photoresist and form the logic area; removing silicon oxynitride layer in the logic area; removing the bottom oxide layer in the logic area; growing top oxide layer on the silicon oxynitride layer and logic area; removing the top oxide layer in the logic area; growing gate oxide layer; forming device structure of SONOS and logic area. The present invention can avoid the damage of top oxide layer and lateral etching in wet etching so as to improve the defect-free rate of devices.

6 Claims, 6 Drawing Sheets

METHOD FOR FABRICATING A SONOS MEMORY

BACKGROUND OF THE INVENTION

1. Technical Field

The present invention relates to the technical field of integrated circuit manufacturing process, and more especially, to a method for making SONOS memory.

2. Description of Related Art

With the advanced IC manufacturing process and decreased line width of photolithography technology, the area of semiconductor device is becoming smaller and smaller. The semiconductor has evolved from common single function device to integrated high-density multi-function IC (integrated circuit); from the initial IC to LSI (large scale integrated circuit), VLSI (very-large scale integrated circuit), even ULSI (ultra-large scale integrated circuit) at present, the chip area keeps reducing and functions become more powerful. Considering the restrictions of many unfavorable factors such as the complexity of technical research and development, long-term performance and expensive costs, chip designers and manufacturers will pay more attention to the problem of how to further improve integrated density on the basis of the existing technology, reduce the chip area and get chips as many as possible from one silicon wafer so as to upgrade the overall interests.

Among various semiconductor technologies, wet etching technology plays a key role in critical steps such as dual gate oxide etching and surface cleaning due to the plasma damage issue and high selectivity requirement. However, the technology has an inherent problem: that is isotropy etch, which indicates that lateral etching concurs along with the proceeding of longitudinal etching and leads to the reliability issue, which is intolerable for devices. Therefore, how to prevent lateral etching of wet etching becomes the problem requiring a solution in the industry.

SONOS is an abbreviation word, which represents a film stack structure of five different materials: silicon, silicon oxide, silicon oxynitride, silicon oxide and polysilicon (from top to bottom). The film stack is one of composite gate structures and is widely used in advanced flash technology. SONOS has very high compatibility with standard CMOS technology, and is provided with numerous advantages such as high durability, low power and high radiation resistance. Moreover, comparing with other embedded non-volatile memories, SONOS provides more stable solutions easier to manufacture with higher performance-price ratio. This technology is widely adopted in industry due to the compact structure and property of downward extension.

Refer to FIG. 1~FIG. 6 for the existing process flow: FIG. 1: deposit the first oxide layer 12, silicon oxynitride 13 and the second oxide layer 14 on silicon underlayer 11 in sequence, set device isolation area 15 in the silicon underlayer 11; FIG. 2: coat a layer of photoresist on the second oxide layer 14, and form a photoresist pattern 16 by exposing; FIG. 3: remove the second oxide layer 14 and the silicon oxynitride layer 13 un-protected by the photoresist pattern 16 via dry etching process in order to avoid plasma induce damage; FIG. 4: remove the first oxide layer 12 un-protected by the photoresist pattern 16 by means of wet etching; FIG. 5: remove the photoresist pattern 16 and grow gate oxide layer 17; FIG. 6: deposit polysilicon 18, perform photo and etch, to form the device structure of SONOS memory. In FIG. 4, during removing the first oxide layer 12 un-protected by the photoresist by means of wet etching, the silicon oxynitride layer 13 and the second oxide layer 14 nearby would be damaged due to isotropy character of wet etch, while the stability of memory storage performance will be downgraded if the second oxide layer 14 as the top oxide layer of memory is partly etched, further leading to reduced conforming rate of device.

SUMMARY OF THE INVENTION

The present invention aims at providing a solution to prevent top oxide layer of SONOS memory from damage or lateral erosion during wet etching.

The present invention provides a method for making SONOS memory, comprising the following steps: depositing a first oxide layer 12 and a silicon oxynitride layer 13 on the underlayer 11 in sequence; coating a layer of photoresist on the silicon oxynitride layer 13; exposing and developing part of the photoresist to expose the logic area; removing the silicon oxynitride layer 13 in the logic area by means of dry etching; removing the first oxide layer 12 in the logic area by means of wet etching; removing the remaining photoresist, and growing a second oxide layer 14 on silicon oxynitride layer 13 and on logic area (at the same time, the second oxide layer 14 would fix the isotropic oxide loss in layer 12 caused by wet process and form spacer nearby the edge of layer 12 and layer 13, which would protect sidewall oxide loss in the following wet process); removing the second oxide layer 14 in the logic area by means of photo and wet etching; growing gate oxide layer 17 on the second oxide layer 14 and the logic area; depositing polysilicon on the gate oxide layer 17, performing photo and etching treatment for the polysilicon in the logic area to form SONOS memory.

Alternatively, the underlayer is provided with a device isolation area.

Alternatively, the thickness of the first oxide layer 12 ranges from 1 angstrom to 500 angstrom.

Alternatively, the thickness of the silicon oxynitride layer 13 ranges from 1 angstrom to 1500 angstrom.

Alternatively, the thickness of the second oxide layer 14 ranges from 1 angstrom to 2000 angstrom.

Alternatively, the thickness of the gate oxide layer 17 ranges from 1 angstrom to 500 angstrom.

Comparing with the existing technology, the present invention has the following favorable effects: the present invention effectively prevents the the first oxide layer 12 and the second oxide layer 14 from film loss and damage during wet etching and enhances the stability of the memory through changing the growth sequence of the second oxide layer 14 (namely the top oxide layer of the memory).

DETAILED DESCRIPTION OF THE INVENTION

The present invention is detailed in combination with the drawings and the embodiments.

Figure 1:
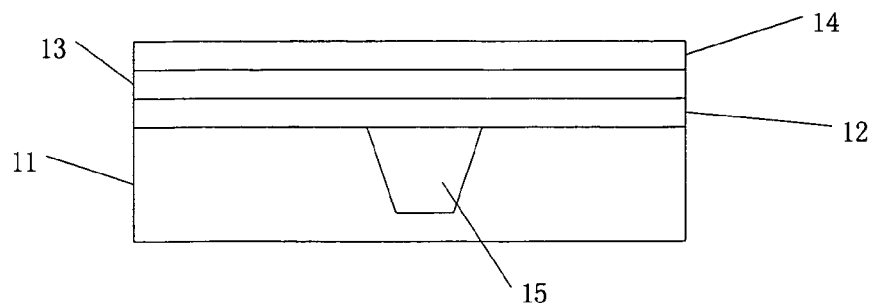
FIG. 1~FIG. 6 show the manufacturing process of the SONOS memory by means of the existing technology.
Figure 2:
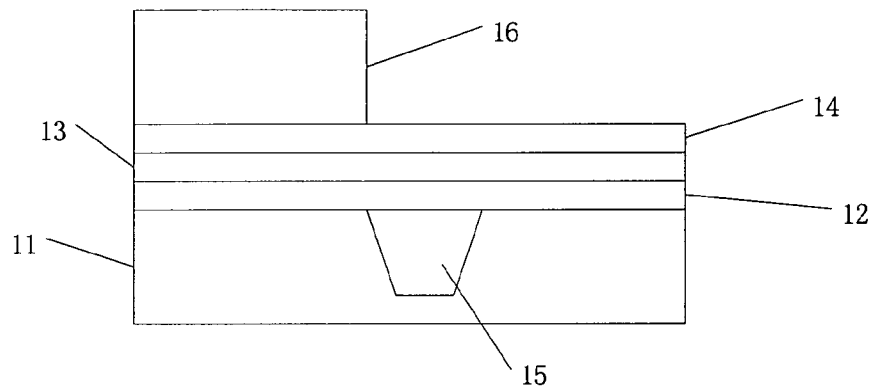
Figure 3:
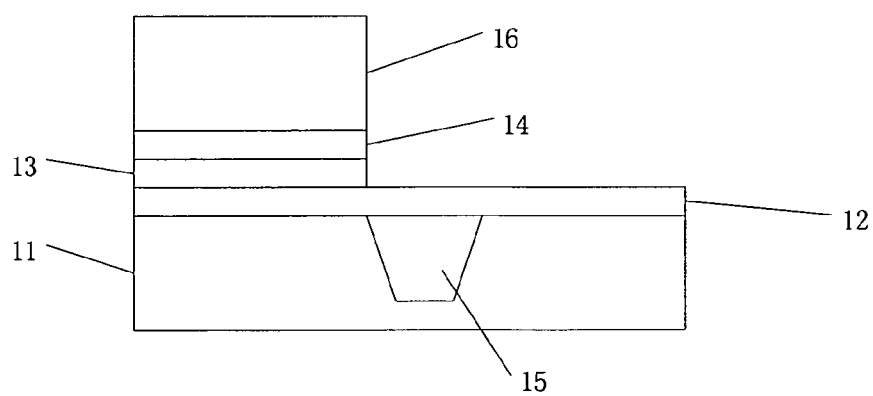
Figure 4:
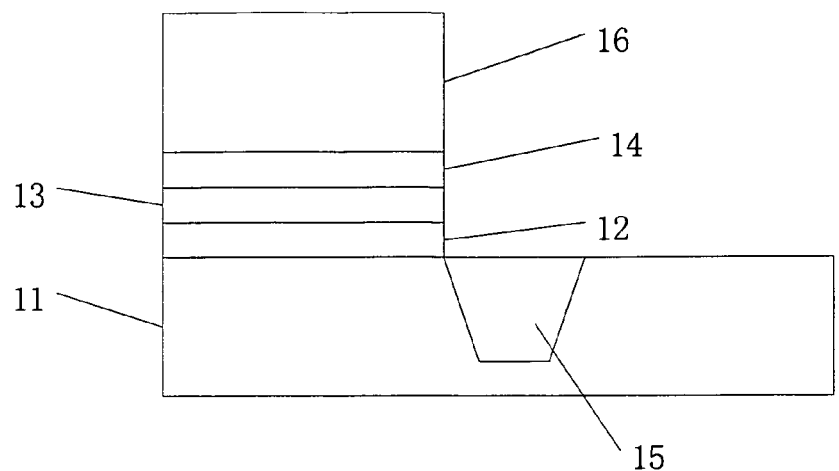
Figure 5:
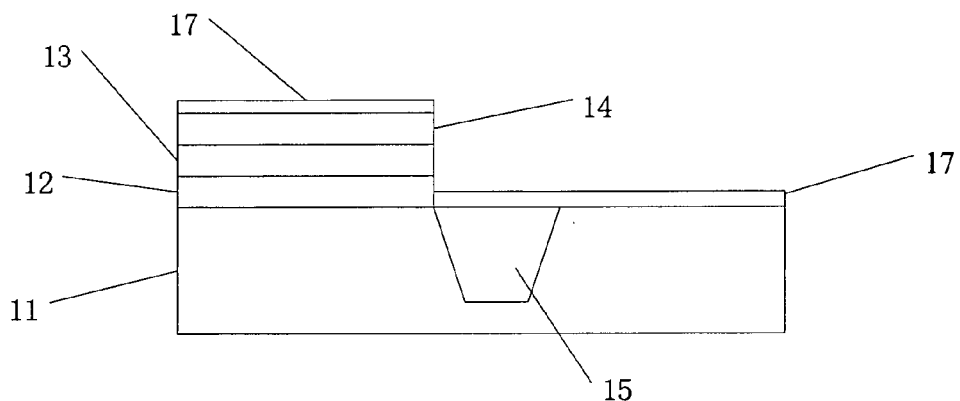
Figure 6:
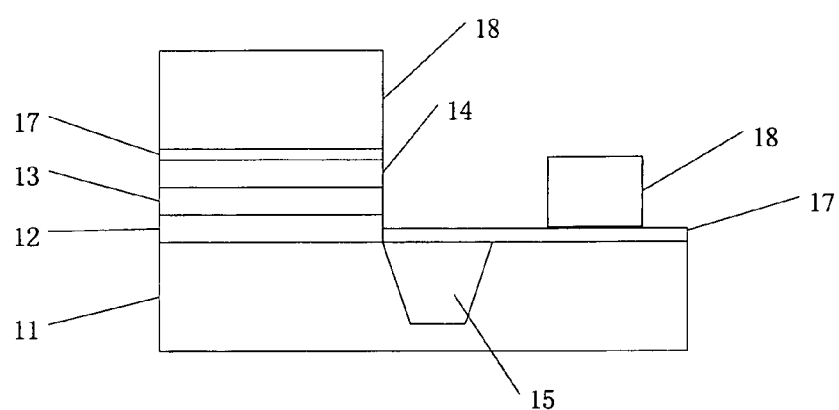
Figure 7:
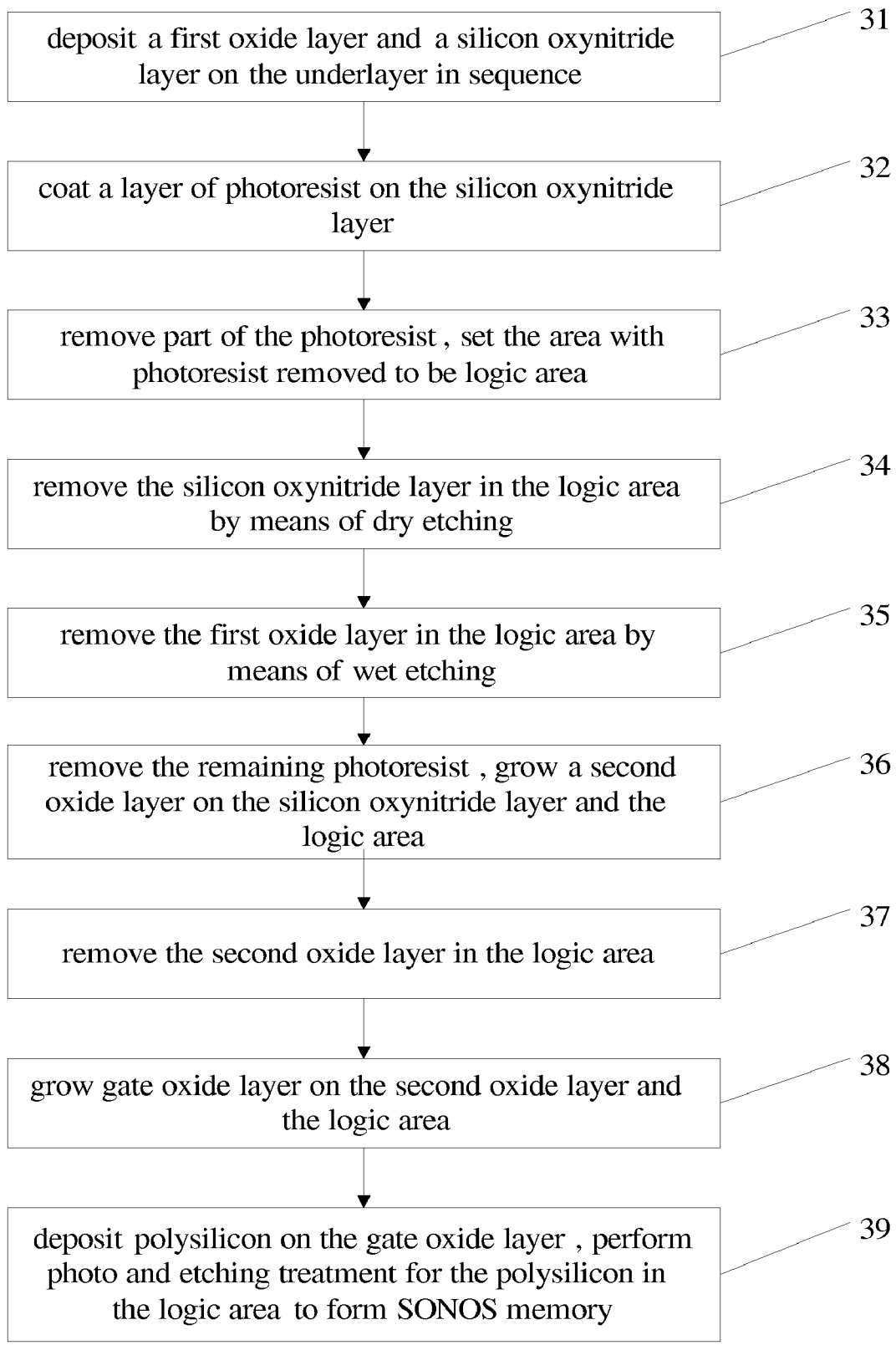
FIG. 7 shows the flow chart of the method for making SONOS memory in the present invention.

Firstly, refer to FIG. 7 for the flow chart of the method for making SONOS memory in the present invention. Please also refer to FIGS. 8~15. As shown in the Figures, the present invention comprises the following steps: Step 31: deposit a first oxide layer 12 and a silicon oxynitride layer 13 on the underlayer 11 in sequence, wherein the first oxide layer 12 is silicon oxide layer, the underlayer 11 is provided with a device isolation area 15, the thickness of the silicon oxide layer 12 ranges from 1 angstrom to 500 angstrom, 20 angstrom preferably, the thickness of the silicon oxynitride layer 13 ranges from 1 angstrom to 1500 angstrom, 145 angstrom preferably. Step 32: coat a layer of photoresist on the silicon oxynitride layer 13, photoresist coating is for forming a protective area so as to prevent the silicon oxide layer 12 and silicon oxynitride layer 13 from being etched in the protective area. Step 33: remove part of the photoresist, set the area with photoresist removed to be logic area on which logic device will be placed, moreover, the isolation area is within the logic area, the silicon oxide layer 12 and silicon oxynitride layer 13 in the logic area may be etched and removed in the subsequent process. Step 34: remove the silicon oxynitride layer 13 in the logic area by means of dry etching, the advantage of dry etching is anisotropy, including plasma etching, reactive ion etching, sputtering etching, magnetically enhanced reactive ion etching, reactive ion beam etching and high-density plasma etching. The present invention adopts plasma etching.

Step 35: remove the first oxide layer 12 in the logic area by means of wet etching, dry etching is anisotropic and will not lead to lateral etching, but dry etching is generally to bombard the surface to be etched, so the substance below the layer to be etched may be damaged, therefore, the first oxide layer 12 in the logic area is removed by means of wet etching only to prevent the underlayer 11 below the first oxide layer 12 from damage. Step 36: remove the remaining photoresist, grow a second oxide layer 14 on the silicon oxynitride layer 13 and the logic area, the second oxide layer 14 is the top oxide layer of the memory. In this case, the second oxide layer 14 would fix the isotropic oxide loss in the first oxide layer 12 caused by wet process and form spacer nearby the edge of the first oxide layer 12 and the silicon oxynitride layer 13, which would protect sidewall oxide loss in the following wet process. The sidewall spacer would guarantee the stability of the storage device in subsequent processes. The thickness of the second oxide layer 14 ranges from 1 angstrom to 2000 angstrom. Step 37: remove the second oxide layer 14 in the logic area by means of photo and wet etching. Step 38: grow gate oxide layer 17 on the second oxide layer 14 and the logic area. Step 39: deposit polysilicon on the gate oxide layer 17, perform photo and etching to form SONOS memory.

Figure 8:
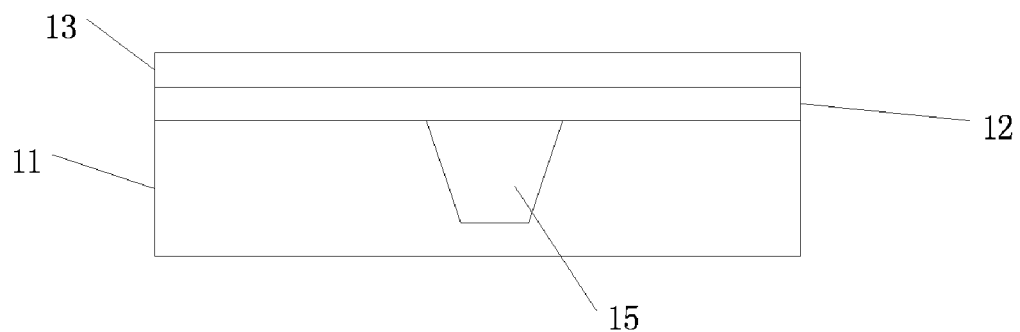
FIG. 8~FIG. 15 show the manufacturing process of the method for making SONOS memory in the present invention.
Figure 9:
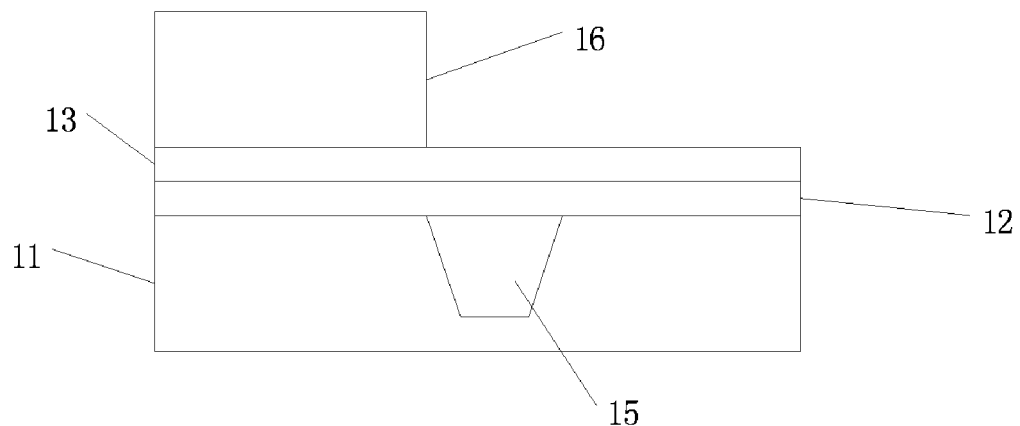
Figure 10:
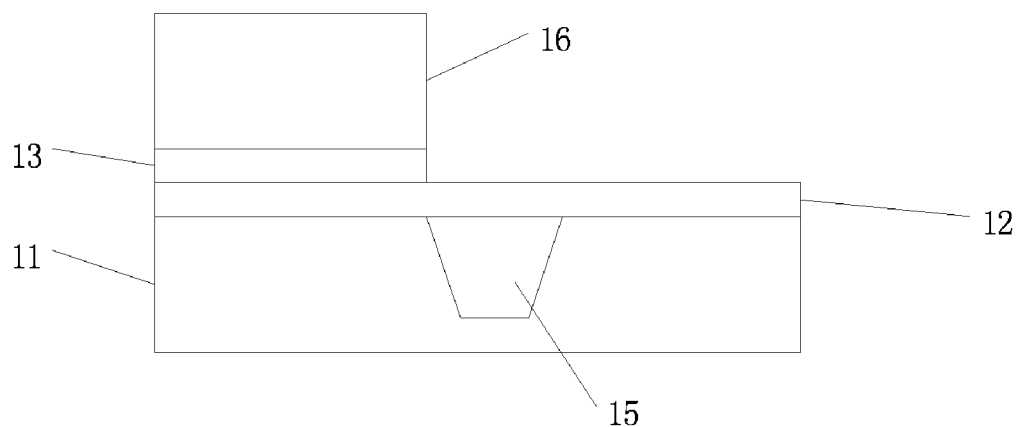
Figure 11:
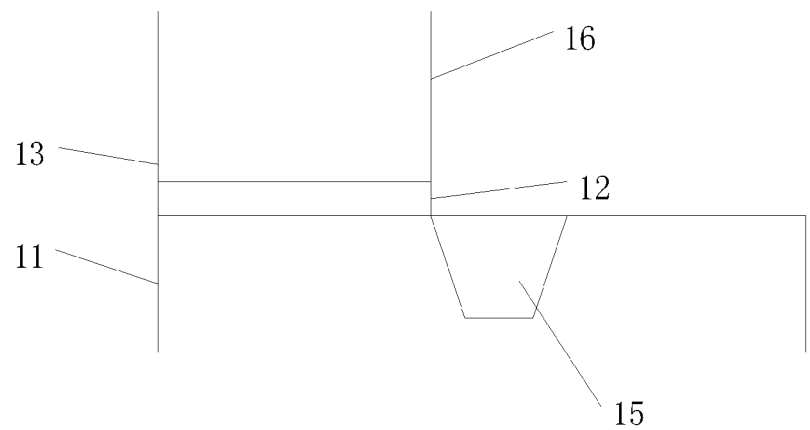
Figure 12:
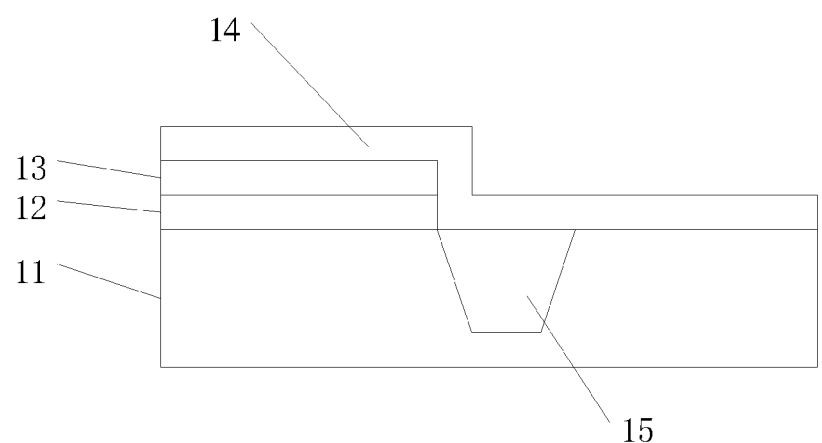
Figure 13:
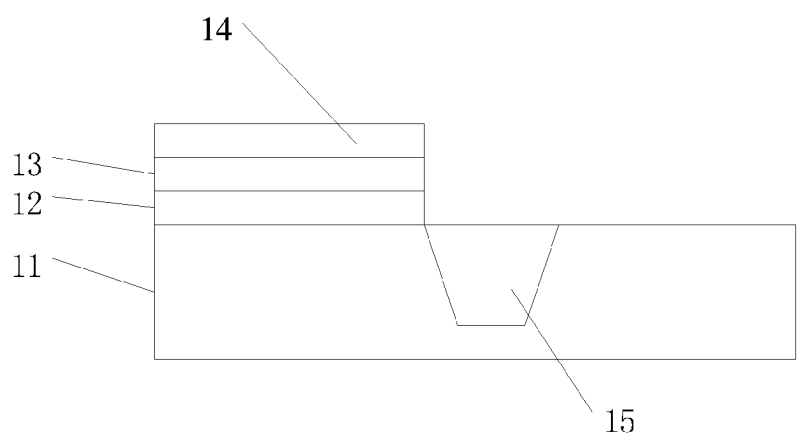
Figure 14:
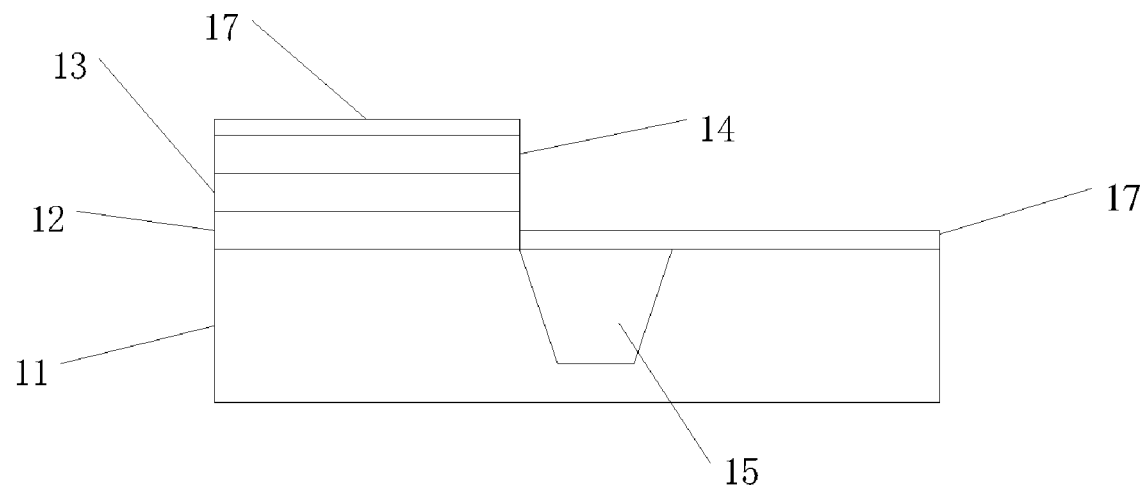
Figure 15:
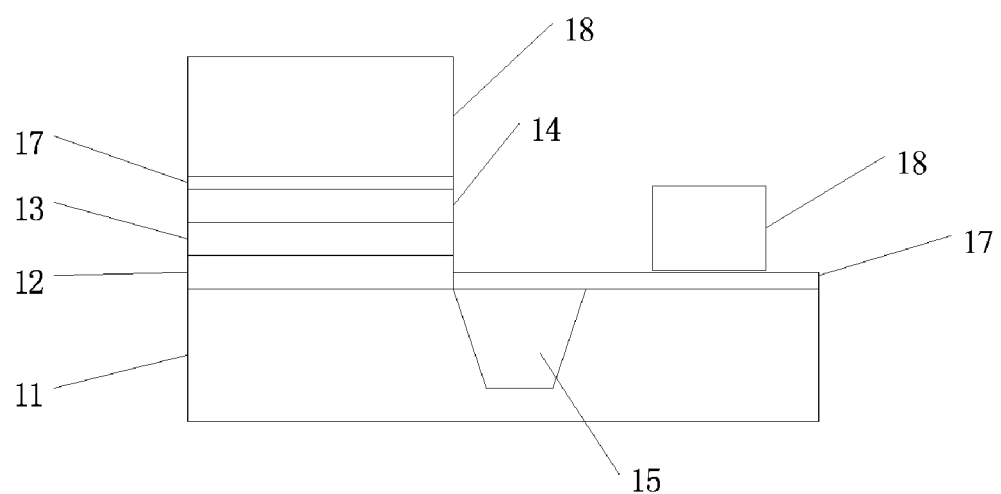

Furthermore, refer to FIG. 8~FIG. 15 for the manufacturing process of the method for making SONOS memory in the present invention. FIG. 8: deposit silicon oxide layer 12 and silicon oxynitride 13 on the silicon underlayer 11 in sequence, set device isolation area 15 on the silicon underlayer 11, the thickness of the silicon oxide layer 12 ranges from 1 angstrom to 500 angstrom, 20 angstrom preferably, the thickness of the silicon oxynitride layer ranges from 1 angstrom to 1500 angstrom, 145 angstrom preferably; FIG. 9: coat a layer of photoresist on the silicon oxynitride layer 13, perform photo treatment and form logic area, the photoresist coating aims at forming protective area so as to protect the silicon oxide layer and silicon oxynitride layer in the protective area from being etched; FIG. 10: remove the silicon oxynitride layer 13 in the logic area by means of dry etching; FIG. 11: remove the silicon oxide layer 12 in the logic area by means of wet etching; FIG. 12: remove the remaining photoresist 16, grow the second oxide layer 14 on the silicon oxynitride layer and the logic area; FIG. 13: remove the second oxide layer 14 in the logic area by means of photo and wet etching; FIG. 14: grow gate oxide layer 17 on the second oxide layer and the logic area, the purpose for growing gate oxide layer is to protect the second oxide layer; FIG. 15: deposit polysilicon 18 on the gate oxide layer 17, perform photo and etching treatment for the polysilicon to form SONOS memory.

The present invention is not limited by the abovementioned preferred embodiments disclosed in the present invention. Technicians skilled in this art may make various changes and modifications without deviating from the spirit and scope of the present invention. Therefore, the protection scope of the present invention shall be subject to the scope limited by the claims.

What is claimed is:

1. A method for making SONOS memory, comprising:
   depositing a first oxide layer and a silicon oxynitride layer in sequence on the underlayer;
   coating a layer of photoresist on the silicon oxynitride layer;
   removing part of the photoresist and setting the area on the underlayer without being covered by the photoresist to be the logic area;
   removing the silicon oxynitride layer in the logic area by means of dry etching;
   removing the first oxide layer in the logic area by means of wet etching;
   removing the remaining photoresist and growing a second oxide layer on the surface of the abovementioned structure;
   removing the second oxide layer in the logic area by means of wet etching;
   growing gate oxide layer on the surface of the second oxide layer and the logic area;
   depositing polysilicon on the gate oxide layer, performing photo and etching treatment for polysilicon in the logic area to form SONOS memory.

2. The method for making SONOS memory according to claim 1, characterized in that a device isolation area is set inside the underlayer, wherein the isolation area is within the logic area.

3. The method for making SONOS memory according to claim 1, characterized in that the thickness of the first oxide layer ranges from 1 angstrom to 500 angstrom.

4. The method for making SONOS memory according to claim 1, characterized in that the thickness of the silicon oxynitride layer ranges from 1 angstrom to 1500 angstrom.

5. The method for making SONOS memory according to claim 1, characterized in that the thickness of the second oxide layer ranges from 1 angstrom to 2000 angstrom.

6. The method for making SONOS memory according to claim 1, characterized in that the thickness of the gate oxide layer ranges from 1 angstrom to 500 angstrom.

* * * * *